(12) United States Patent
Hsu et al.

(10) Patent No.: US 9,425,086 B2
(45) Date of Patent: Aug. 23, 2016

(54) METHOD OF CONTROLLING CONTACT HOLE PROFILE FOR METAL FILL-IN

(71) Applicant: Macronix International Co., Ltd., Hsinchu (TW)

(72) Inventors: Fang-Hao Hsu, Hsinchu (TW); Hsu-Sheng Yu, Hsinchu County (TW); Kuo-Feng Lo, New Taipei (TW); Hong-Ji Lee, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/138,007

(22) Filed: Dec. 21, 2013

(65) Prior Publication Data

US 2015/0179569 A1    Jun. 25, 2015

(51) Int. Cl.
*H01L 21/768* (2006.01)
*H01L 23/485* (2006.01)
*H01L 23/31* (2006.01)
*H01L 23/532* (2006.01)

(52) U.S. Cl.
CPC .... *H01L 21/76802* (2013.01); *H01L 21/76804* (2013.01); *H01L 21/76831* (2013.01); *H01L 23/485* (2013.01); *H01L 23/3192* (2013.01); *H01L 23/53257* (2013.01); *H01L 2924/00* (2013.01); *H01L 2924/0002* (2013.01)

(58) Field of Classification Search
CPC .................................................. H01L 2924/00
See application file for complete search history.

(56) References Cited

U.S. PATENT DOCUMENTS

| | | | |
|---|---|---|---|
| 2008/0113508 A1* | 5/2008 | Akolkar et al. | 438/687 |
| 2008/0311711 A1* | 12/2008 | Hampp et al. | 438/197 |
| 2009/0137119 A1* | 5/2009 | Liu et al. | 438/675 |
| 2009/0200636 A1* | 8/2009 | Edelstein | H01L 21/0273 257/522 |
| 2010/0185314 A1* | 7/2010 | Xu | B24B 37/005 700/109 |
| 2012/0037877 A1* | 2/2012 | Breitwisch | H01L 45/06 257/3 |
| 2013/0320542 A1* | 12/2013 | Chang et al. | 257/751 |

* cited by examiner

*Primary Examiner* — Thao X Le
*Assistant Examiner* — Xia L Cross
(74) *Attorney, Agent, or Firm* — Fish & Richardson P.C.

(57) ABSTRACT

A method of eliminating overhang in a contact hole formed in a contact film stack is described. A liner layer is overlaid on the contact film stack, the liner also coating the contact hole. A portion of the liner is removed to expose the overhang, and the exposed overhang is removed. The liner is also used to fill-in a bowing profile of the contact hole, thereby rendering sidewalls of the contact hole smooth and straight suitable for metal fill-in while suppressing piping defects.

20 Claims, 6 Drawing Sheets

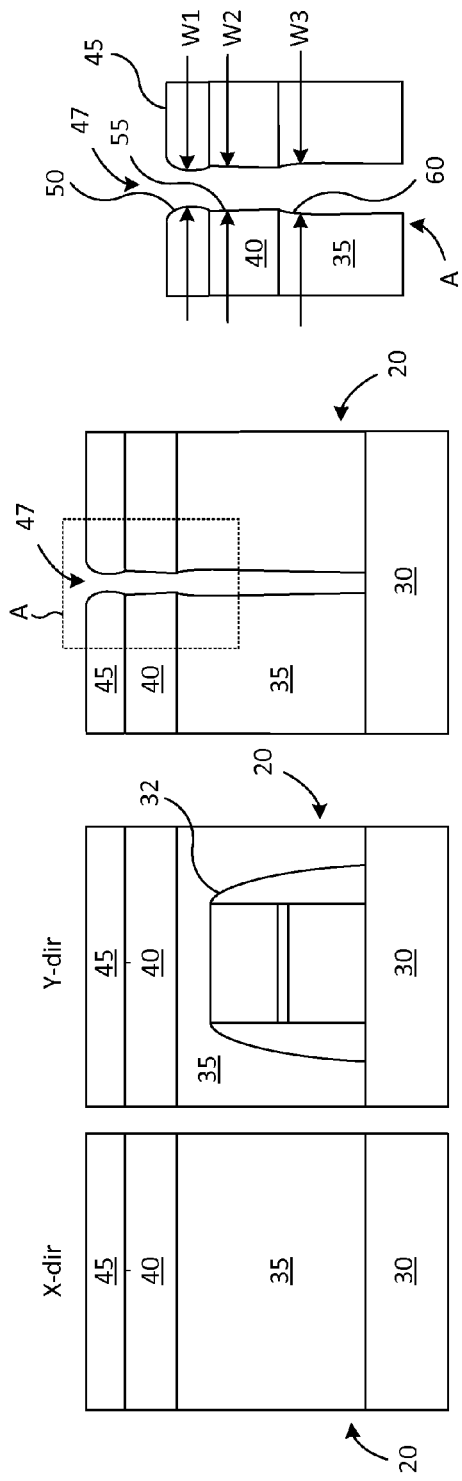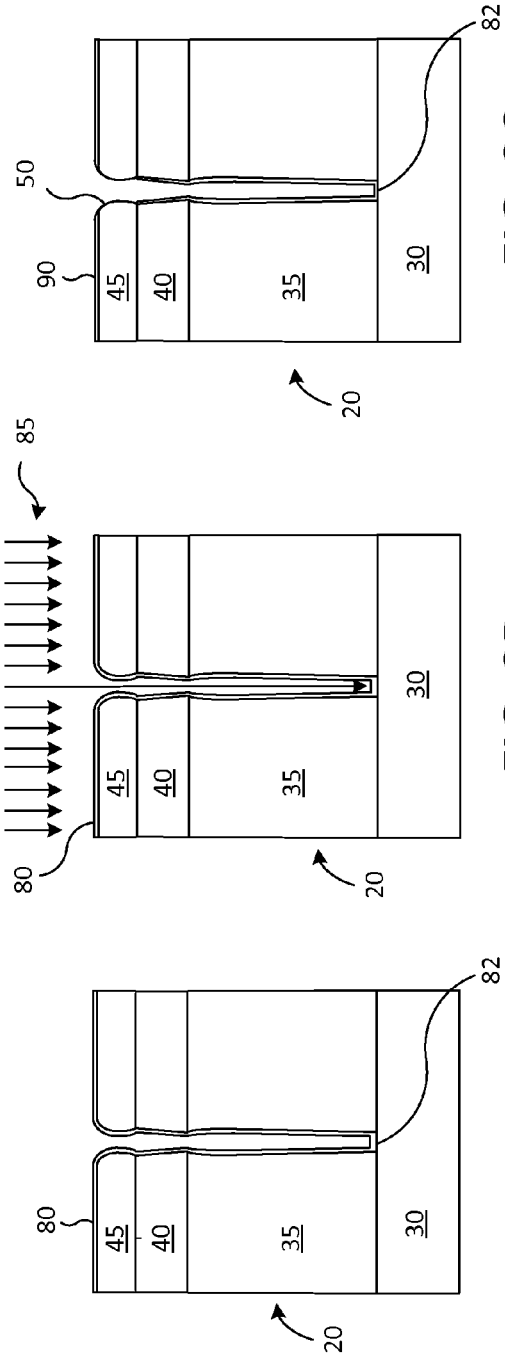

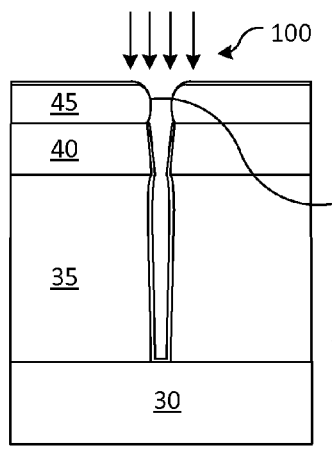
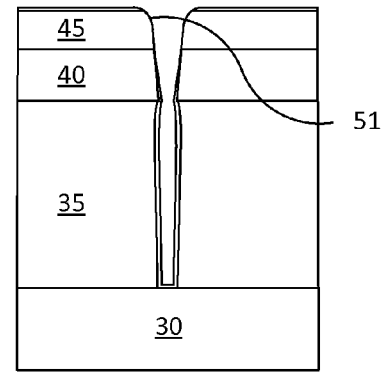
FIG. 3A  FIG. 3B
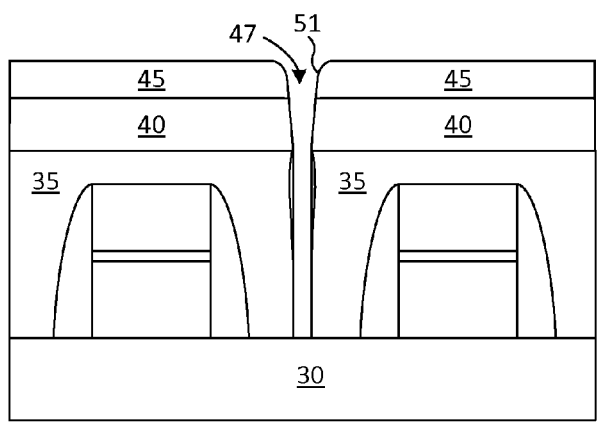
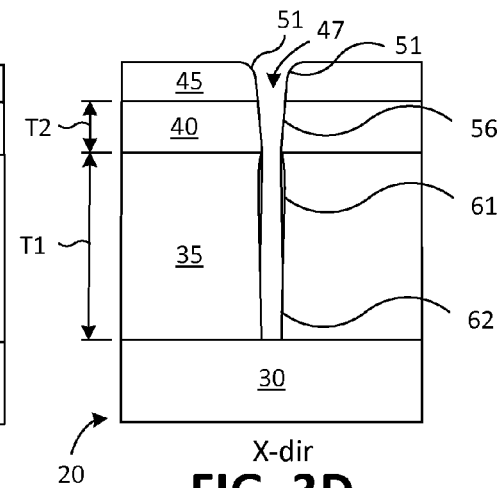
FIG. 3C  FIG. 3D
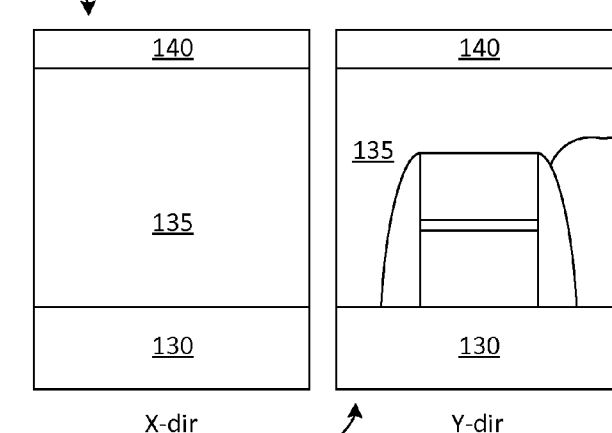
FIG. 4A  FIG. 4B  FIG. 4C

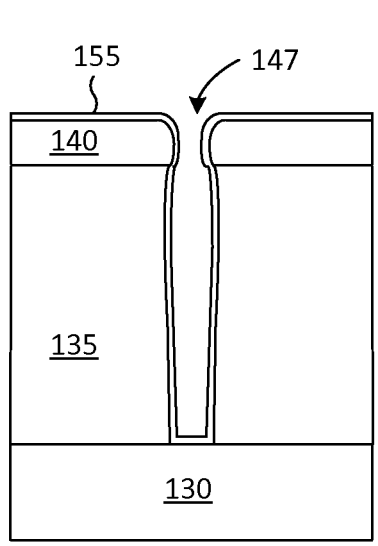
FIG. 5A
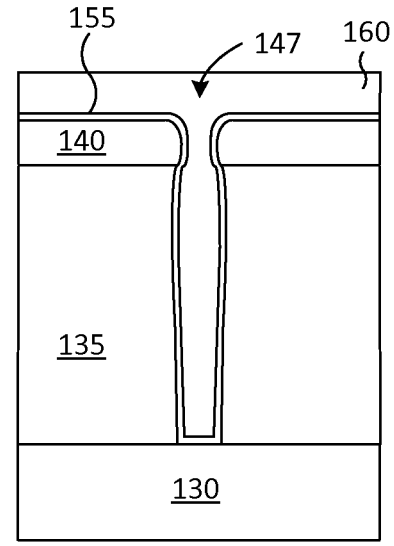
FIG. 5B
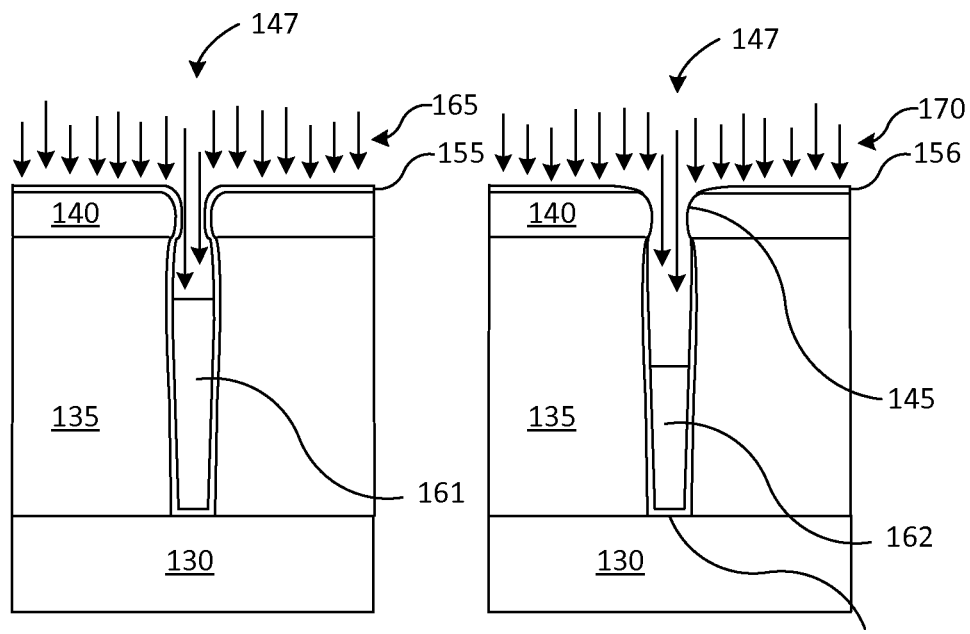
FIG. 5C
FIG. 5D

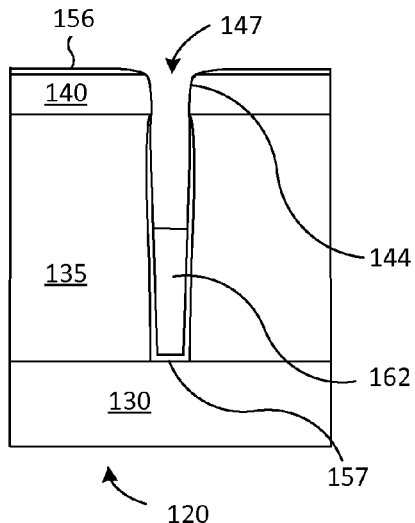
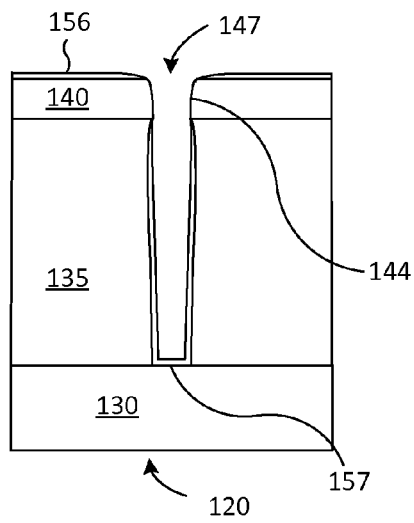
FIG. 6A　　　FIG. 6B
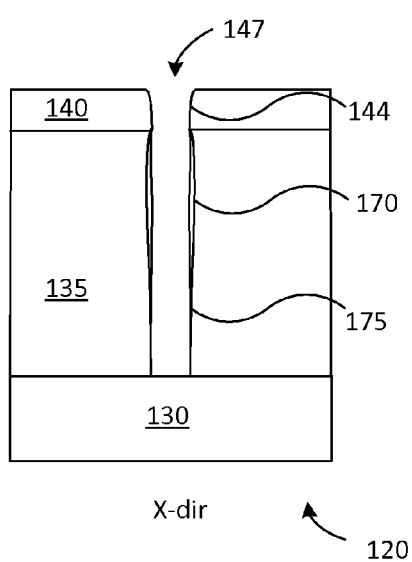
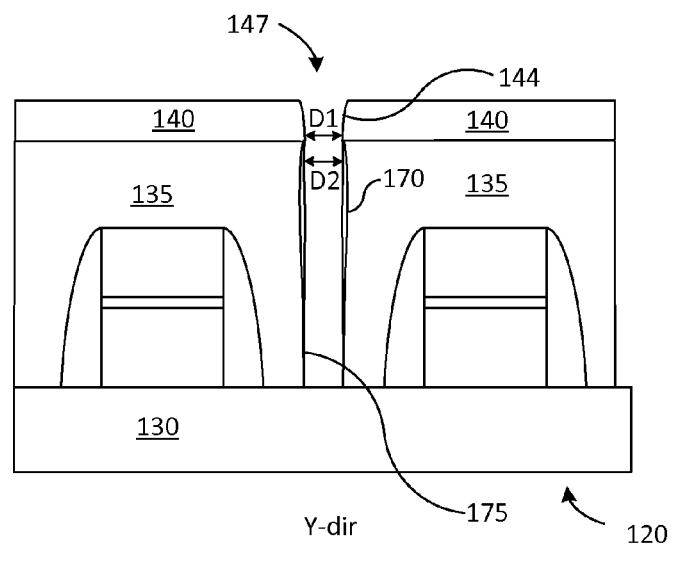
FIG. 6C　　　FIG. 6D

US 9,425,086 B2

METHOD OF CONTROLLING CONTACT HOLE PROFILE FOR METAL FILL-IN

BACKGROUND OF THE INVENTION

1. Field of the Invention

The present invention relates generally to semiconductor fabrication methods and, more particularly, to metal fill-in of small contact holes.

2. Description of Related Art

Metal fill-in of contact holes in integrated circuits employing sub-32 nm technology is complicated by the presence of profile irregularities which may form using prior art methods of contact hole formation. Irregularities such as overhang and bowing in contact hole profiles can cause, for example, voids or seams in filled-in metal, thereby reducing the conductance of a contact to be formed through the contact hole. Failure to control such conductance can degrade reliability, reduce yields, and increase manufacturing costs of integrated circuits.

A need thus exists in the prior art for a method to reduce and/or eliminate effects of overhang profiles in integrated circuit contact holes. A further need exists for methods to mitigate effects of bowing.

SUMMARY OF THE INVENTION

The present invention addresses these needs by providing a method of removing an overhang from an opening of a contact hole formed through a contact film stack of integrated circuit material. According to the invention herein disclosed, a contact film stack is formed using a plurality of layers of dielectric (e.g., oxide) material, and a contact hole is formed in the contact film stack. A surface of the contact film stack and an interior of the contact hole are coated with liner material. The liner material is removed to expose an overhang near the surface, and then the overhang is removed.

One method of the invention uses the plurality of layers of dielectric material to control a profile of the contact hole. The plurality of dielectric layers may be formed using, as examples, plasma-enhanced oxide (PEOX), low-pressure chemical vapor deposition from tetraethyl orthosilicate (LP-TEOS), borophosphosilicate glass (BPSG), or undoped silicon glass (USG). These oxides may produce a rounded profile in a top oxide layer, a tapered profile in a lower oxide layer and/or a bowing profile in another oxide layer.

An implementation of the method of coating with liner material comprises growing a layer of silicon nitride, which may suppress piping. The silicon nitride may be partially removed by using bombardment, such as argon bombardment, to expose the overhang. The overhang may be removed by performing an etch having a high oxide selectivity with respect to silicon nitride.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 1A is a cross-section of a contact film stack viewed from an X-direction;

FIG. 1B is a cross-section of the contact film stack of FIG. 1A viewed from a Y-direction;

FIG. 1C is a cross-sectional view illustrating a contact hole formed in the contact film stack of FIGS. 1A and 1B;

FIG. 1D is a detailed view of a portion of the contact hole in the contact film stack of FIG. 1C that emphasizes an overhang and a bowing profile;

FIG. 2A is a cross-sectional view of the contact film stack of FIG. 1C after deposition of a liner layer;

FIG. 2B is a cross-sectional view of the contact film stack of FIG. 2A illustrating bombardment with argon;

FIG. 2C is an illustration of the effect of argon bombardment that removes a portion of the liner from the contact film stack of FIG. 2B;

FIG. 3A is a depiction of an etch step that removes a portion of the overhang from the contact film stack of FIG. 2C;

FIG. 3B is an illustration of an effect of the etch step of FIG. 3A emphasizing a rounding of the overhang;

FIG. 3C is a cross-section of the contact film stack of FIG. 3B after an anisotropic etch step to remove liner, the cross-section being viewed from the Y-direction;

FIG. 3D is an X-direction cross-sectional view of the contact film stack of FIG. 3C;

FIG. 4A is a cross-sectional view of another contact film stack viewed from an X-direction;

FIG. 4B is a cross-sectional illustration of the contact film stack of FIG. 4A viewed from a Y-direction;

FIG. 4C is an illustration of a contact hole formed in the contact film stack of FIGS. 4A and 4B depicting an overhang and a bowing profile;

FIG. 5A is a cross-sectional view of the contact film stack of FIG. 4C after deposition of a liner layer;

FIG. 5B is an illustration of the contact film stack of FIG. 5A after deposition of an organic dielectric layer (ODL);

FIG. 5C is a depiction of bombardment of the contact film stack of FIG. 5B with argon;

FIG. 5D is an illustration of an etch step applied to the contact film stack of FIG. 5C for a purpose of removing a portion of the overhang;

FIG. 6A is a graphical depiction of the effect of the etch step on the contact film stack of FIG. 5D whereby a portion of the overhang is removed;

FIG. 6B is a cross-sectional illustration of the contact film stack of FIG. 6A after removal of the ODL by a dry/wet etch process;

FIG. 6C is an X-direction view of the contact film stack of FIG. 6B after an anisotropic etch step that removes liner material;

FIG. 6D is an illustration of the contact film stack of FIG. 6C viewed from the Y-direction;

DETAILED DESCRIPTION OF THE PRESENTLY PREFERRED EMBODIMENTS

Figure 7:
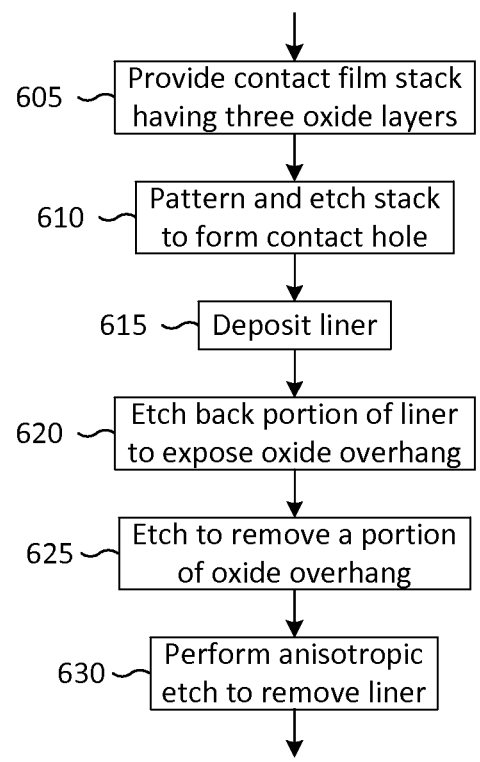
FIG. 7 is a flow diagram describing one implementation of a method of the present invention.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to formation of contact holes in integrated circuit material and a related method of manufacture.

Referring more particularly to the drawings, FIG. 1A is a cross-sectional view of a contact film stack 20, which may be referred to as an interconnect structure, viewed from an X-direction. The contact film stack 20 is formed on a substrate 30, which may be formed, for example, of silicon. First, second, and third dielectric (e.g., oxide) layers 35, 40 and 45, respectively, are disposed above the substrate 30. The first oxide layer 35 may be formed of, for example, undoped silicate glass (USG), borophosphosilicate glass (BPSG) or phosphosilicate glass (PSG); the second oxide layer 40 may be formed of, for example, high density plasma (HDP) oxide; and the third layer 45 may comprise a plasma-enhanced oxide layer (PEOX). The plurality of dielectric layers may be formed using, as examples, in addition to PEOX, low-pressure chemical vapor deposition from tetraethyl orthosilicate (LPTEOS), BPSG, or USG. According to the illustrated embodiment, a hardness degree of the oxides is hardness of third layer 45>hardness of second layer 40>hardness of first layer 35. Formation of the first, second and third oxide layers 35, 40 and 45 may be accomplished using methods known in the art. For example, dielectric material may be deposited on the substrate 30 to form the first oxide layer 35, and layers of dielectric, and plasma-enhanced dielectric, may be deposited sequentially over the first oxide layer 35 to form the second and third oxide layers 40 and 45. FIG. 1B is a cross-sectional view of the contact film stack 20 of FIG. 1A viewed from a Y-direction. This view of the contact film stack portrays the same layers as those of FIG. 1B and, further, contains embedded therein an active structure 32.

FIG. 1C illustrates a contact hole 47 formed in the contact film stack 20 of FIGS. 1A and 1B. The contact hole 47 may be formed by patterning an upper surface of the contact film stack 20 and etching with $CHF_3$, $CH_2F_2$, $C_4F_6$ or $C_5F_8$, according to one example. In representative embodiments, widths of the contact hole 47, measured in a direction transverse to a surface or boundary of the substrate 30, may range from about 10 nm to about 100 nm, with a typical dimension being about 50 nm.

By varying the composition of each of the oxide layers, different profiles may be predetermined, pre-designed and/or generated/obtained as illustrated in FIG. 1D, which depicts detail of a portion A encompassed by the phantom lines of FIG. 1C. These special or rugged profiles may include a top rounding (e.g., overhang) profile 50 in the third oxide layer 45, a diameter-changing (e.g., tapering) profile 55 in the second oxide layer 40, and/or a bowing profile 60, which may, for example, exhibit tapers in upper and/or lower regions thereof, in the first oxide layer 35. Etch rates of the oxide layers may be affected by controlling oxide quality and type using, for example, PEOX, LPTEOS, BPSG and/or USG and/or by varying a boron-to-phosphorus doping ratio. Depending upon the forms of oxides used to form the contact film stack 20, the enumerated profiles may exhibit widths W1, W2, and W3. That is, the overhang 50 may have an effect of constricting a width of the contact hole to W1 in a neighborhood of the overhang 50. Similarly, the tapered profile 55 may exhibit a width W2 near an upper portion thereof, and the bowing profile 60 may be as wide as W3. In the present example, W1<W2<W3. In a few typical scenarios, the width W1 may range from about 10 nm to about 100 nm, for instance, about 45 nm, with the width W2 ranging from about 11 nm to about 130 nm with an exemplary value being about 48 nm, and the width W3 may from about 12 nm to about 140 nm with an exemplary value being about 60 nm.

A liner may be formed inside the contact holes, e.g., contact hole 47, which liner may beneficially reduce ruggedness and/or suppress effects of piping. Piping may comprise a hole-to-hole bridge, (i.e., an undesired connection after metal fill-in) between contact holes resulting from voids that can form in dielectric (e.g., oxide) layers intended to isolate the contact holes. For example, reference is made to FIG. 2A, which is a cross-sectional view of the contact film stack of FIG. 1C after deposition of such a liner layer. Here, the contact film stack 20 is overlaid with a liner layer 80, which may be formed of silicon nitride. According to this aspect of the invention, the silicon nitride layer 80 is formed using known techniques to thicknesses ranging, typically, from about 20 Å to about 200 Å, with a typical thickness being about 50 Å.

FIG. 2B is a cross-sectional view of the contact film stack 20 of FIG. 2A illustrating bombardment, e.g., with particles such as argon, and FIG. 2C is an illustration of the effect following such (e.g., argon) bombardment that removes a portion of the liner layer 80 from the contact film stack 20 of FIG. 2B. The bombardment can result in removal of a part of or substantially all of the liner layer 80 at the top corner (i.e., at the overhang 50 of the contact hole 47) and W1 locations (cf. FIG. 1D). In a typical implementation, the percentages of liner layer 80 removed (measured in a direction of the thickness of the liner layer 80) at the top corner can range from about 80% to about 100% with an exemplary percentage being about 100%, and/or the percentages of liner layer 80 removed (measured, again, in a direction of the thickness of the liner layer 80, i.e., in a direction perpendicular to the surface 45 at the point of measurement/removal/interest) at W1 can range from about 80% to about 100% with an exemplary percentage being about 100%.

With the overhang 50 exposed, or closer to being exposed, an etch 100 having a high oxide selectivity with respect to the liner (e.g., employing one or more etching gases such as, for example, $C_4F_6$, $C_4F_8$ or $C_5F_8$) may be performed as depicted in FIGS. 3A and 3B to remove material of the overhang portion 50 of the third oxide layer 45. In representative embodiments, a selectivity ratio of oxide to silicon nitride may range from about 2 to about 30, a preferred value being about 15. The high selectivity ratio of oxide to silicon nitride can operate to accomplish rapid corner rounding of the PEOX following breaking through the liner 80 at the corner. As used herein, a statement that an etch has a high selectivity to material A with respect to material B means that the etch has a much stronger effect on A than on B with a result that much more of A than B is removed when the etch acts on both materials. FIG. 3B illustrates a result of this etch step emphasizing that the overhang 50 has been removed and that a corner 51 of the contact hole 47 is rounded and smooth.

An anisotropic etch employing, as examples, etchants $CH_2F_2$, $CH_3F$, or $CHF_3$, is performed next to remove portions of the liner layer 80 remaining FIGS. 3C and 3D illustrate an effect of the anisotropic etch. Liner material has been removed from the upper surface of the contact film stack 20, from the diameter-changing profile 56 (FIG. 3D) and from a lower portion 62 of the first oxide layer 35, thereby creating a tapered opening in the contact hole 47. The anisotropy of the etch prevents removal, however, of a portion of the liner material that fills the bowing profile region 61 of the first oxide layer 35, thereby forming a contact hole 47 having sides more conducive to filling. For instance, the sides may form or contribute to a taper in which diameters of the contact hole 47 generally decrease (e.g., at constant, changing, or constant/changing rate(s)) along a depth of the contact hole in a direction extending into the hole; the depth may extend just into or through layer 45 (or, alternatively, layers 45 and 40), or may extend further into or mostly through the contact hole). According to certain embodiments, the etch yields tapering through layers 45 and 40 of relatively, somewhat, more, or substantially straight, smooth sides. In some embodiments, sides along the depth of part(s) of the contact hole 47 may exhibit tapers in varying degrees, as illustrated, for example, or according to other embodiments/structures such as, for instance, as indicated above or as one of skill in the art would understand to be feasible and/or desirable. Similar structure exists at this stage in the Y-direction (FIG. 3C). Insulating properties of the liner material that fills the bowing profile region 61 may provide protection against effects of piping by providing isolation between the interior of the contact hole 47 and any piping defects (not shown) in the oxide surrounding the contact hole 47. Relative to suppression of piping, which typically occurs between tops of active elements 32 (cf. FIG. 1B), a thickness T1 of the first oxide layer 35 (FIG. 3D) should be greater than a height of the active element 32; a thickness T2 of the second oxide layer 40 has no limitation.

FIG. 4A is a cross-sectional view of another contact film stack 120 viewed from an X-direction; a Y-direction view of contact film stack 120 is illustrated in FIG. 4B. The contact film stack 120 may be formed on a substrate 130, which may be a silicon substrate. A first dielectric layer 135, which may be formed of an oxide such as BPSG, USG or PSG and a second dielectric layer 140, which may be formed of PEOX, are disposed above the substrate 130. Fabrication steps in forming the contact film stack 120 may be similar to those described above with reference to FIGS. 1A and 1B. The contact film stack 120 may further contain an active area 132 visible in FIG. 4B.

FIG. 4C describes a contact hole 147 formed in the contact film stack 120 of FIGS. 4A and 4B. One method of forming the contact hole 147 may comprise patterning an upper surface of the contact film stack 120 and etching with, for example, $CHF_3$, $CH_2F_2$ or $C_4F_6$. A typical diameter of the contact hole 147 may range from about 10 nm to about 100 nm, with a preferred value of about 50 nm. As illustrated in FIG. 4C, the contact hole 147 may exhibit an overhang 145 in the second dielectric layer 140 that partially occludes an opening of the contact hole 147. Further, in the example illustrated, the first dielectric layer 135 presents a bowing profile 150 that may, or in certain scenarios may not, constitute a deviation from a desired straight and smooth profile for the contact hole 147. Depending upon the material used to form the first dielectric 135, the degree of bowing 150 may range from about 2% to about 50%, the percentage being defined as a ratio of a deviation from a preferred diameter of the contact hole 147 to the preferred diameter, the deviation being measured at the widest point of the bowing profile 150.

To mitigate the effects of the overhang 145 and the bowing profile 150, a liner layer 155 may be formed (e.g., grown) over the contact film stack 120 as illustrated in FIG. 5A. The liner layer 155 may be formed of silicon nitride, may overlay the upper surface of the contact film stack 120, and may line the interior of the contact hole 147 to a thickness that ranges from about 20 Å to about 200 Å with an exemplary thickness being about 50 Å.

The structure of FIG. 5A may, further, be overlaid with an organic dielectric layer (ODL) 160 as depicted in FIG. 5B. Materials for forming the ODL may include ashable amorphous carbon or C—H, C—O chemical structures as examples. The ODL 160 may substantially fill the contact hole 147 and may overlay the surface of the contact film stack 120. The structure of FIG. 5B subsequently may be bombarded with particles (e.g., argon) 165, to remove a surface portion of the ODL layer 160 as illustrated in FIG. 5C. The bombarding may, further, remove a portion of the liner layer 155 to expose the overhang portion 145 (cf. FIG. 5D) of the second oxide layer and may reduce a surface thickness of the liner layer 155 so that the thickness of the liner layer 156 in FIG. 5D is less than the corresponding thickness of liner layer 155 in FIG. 5C. A lower portion 161 of the ODL layer may be retained after the bombardment, the retained portion 161 acting to protect a bottom of the contact hole 147 during subsequent processing.

With the overhang 145 at least partially exposed, a subsequent etch step employing an etching agent 170 such as $C_4F_6$, $C_4F_8$ or $C_5F_8$, which exhibits a high selectivity to oxide as compared to silicon nitride, may be performed. A result of this etch step is depicted in FIG. 6A, whereby effective removal of the overhang 145 (FIG. 5D) has resulted in a corner profile 144 that is round and smooth.

Note that during the high oxide-selectivity etch, although even more of the ODL may be removed, a residual portion 162 remains in a lower region of the contact hole 147, which residual portion 162 continues to protect the bottom 157 of the contact hole 147.

The remaining ODL 162 may then be removed using a dry/wet process. The dry etch may be performed using, for example, $N_2H_2$, $CF_4$, $O_2$; the wet etch may employ $H_2SO_4/H_2O_2$, $NF_4OH/H_2O_2/DI$. Removal of the ODL 162 may leave a structure that, except for the smooth and rounded corner 144, is overlaid with liner material 156 as illustrated in FIG. 6B. The liner material 156 may be removed using an anisotropic etch applying etchants such as $CH_2F_2$, $CH_3F$, or $CHF_3$. FIGS. 6C (X-direction) and 6D (Y-direction) illustrate the effect of the anisotropic etch. Substantially all surfaces of the contact hole 147, including the rounded corner region 144 and a lower portion 175, are free of liner material. An exception is the bowing portion 170 of the contact hole 147, which is filled-in by liner material, thereby rendering sidewalls of the contact hole 147 somewhat, relatively, more, or substantially straight, smooth, and suitable for fill-in with conductive material such as tungsten, thereby enabling electrical contact. As illustrated in FIG. 6D, the contact hole 147 may exhibit an upper opening having a first dimension D1, measured in a radial direction of the opening, the upper opening being disposed in dielectric material (e.g., the second oxide layer 140). A tapered opening may be disposed below the upper opening, the tapered opening having a second dimension D2, measured in the radial direction, representing a cross-section of the contact hole 147 in a portion filled-in by liner material. According to a feature of the invention, the second dimension can be formed to be not less than the first dimension. In a typical embodiment, the first distance D1 is greater than or equal to the second distance D2.

FIG. 7 is a flow diagram that summarizes one implementation of a method of the invention, whereby effects of the imperfections (including an overhang 50, a taper 55, and a bowing profile 60) already enumerated above with reference to FIGS. 1A, 1B and 1C may be reduced or eliminated. According to the illustrated implementation, a contact film stack 20 having three dielectric (e.g., oxide) layers 35, 40, and 45 is provided at step 605 as described supra and as illustrated in FIGS. 1A and 1B. Further, at step 610, a contact hole 47 is formed in the contact film stack 20 as has been described above with reference to FIG. 1C. At step 615 a liner layer is formed (e.g., grown and/or otherwise deposited) over the contact film stack 20. For example, FIG. 2A depicts the contact film stack 20 overlaid with a liner layer 80, which may be formed of silicon nitride. The liner layer 80 overlays the upper surface of the third oxide layer 45 and, further, lines an interior surface of the contact hole 47 including material 82 that overlays the bottom thereof.

Continuing with the implementation of FIG. 7, a portion of the liner layer 80 is etched back at step 620 to expose the overhang 50. This etchback step, illustrated in FIG. 2B, may comprise bombarding the contact film stack 20 with particles, such as argon 85. FIG. 2C illustrates a result of the bombardment, whereby the overhang 50 is exposed. In addition, an upper portion 90 and a lower surface 82 of the liner layer may be partially removed so that a thickness of the upper portion 90 and the lower surface 82 is less than a thickness of the original liner layer 80 (FIG. 2A).

At step 625, an etch 100 having high selectivity to oxide with respect to the liner (e.g., a highly oxide-selective etch employing gases such as, for example, $C_4F_6$, $C_4F_8$ or $C_5F_8$) may be performed as depicted in FIG. 3A to remove material of the overhang portion 50 of the third oxide layer 45. FIG. 3B illustrates the result of this etch step subsequent to removal of the overhang 50.

With continuing reference to FIG. 7, an anisotropic etch employing, as examples, etchants $CH_2F_2$, $CH_3F$, or $CHF_3$, is performed at step 630 to remove portions of the liner remaining after step 625, cf. FIGS. 3C and 3D. Exceptionally, the anisotropy of the etch permits retention of a portion 61 of the liner layer, thereby rendering the portion of the contact hole 47 formed through the first oxide layer 35 to be somewhat or substantially straight and smooth.

Figure 8:
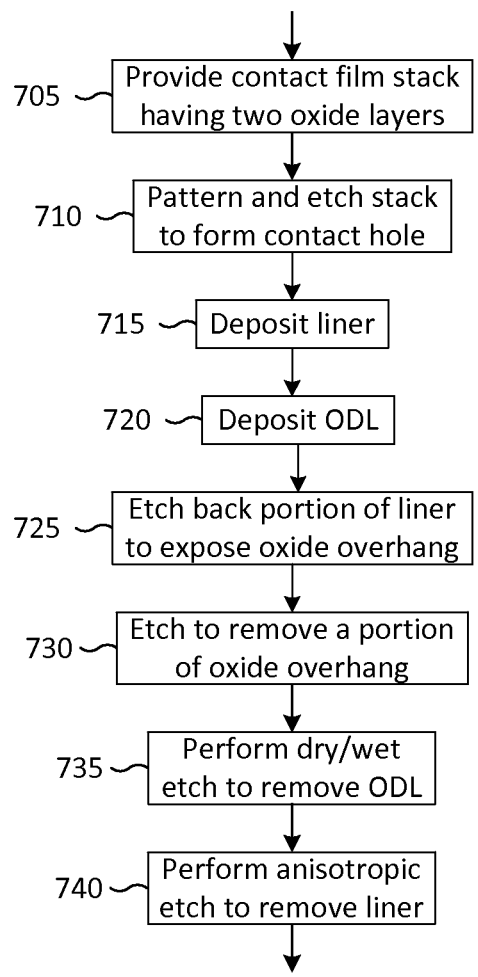
FIG. 8 is a flow diagram depicting an implementation of another method of the present invention.

FIG. 8 is a flow diagram describing an implementation of another method of the present invention, this implementation being based upon the structure introduced and described above with reference to FIGS. 4A and 4B. Per the implementation of FIG. 8, a contact film stack 120 having two dielectric (e.g., oxide) layers, a first oxide layer 135 and a second oxide layer 140, is provided at step 705, the structure illustrated in FIGS. 4A and 4B being examples thereof. At step 710 a surface of the contact film stack 120 is patterned and etched to form a contact hole 147. An example is illustrated in FIG. 4C wherein it is noted that the forming of a contact hole 147 has resulted in an overhang (e.g., an oxide overhang) 145 near the surface of the contact film stack 120. The contact hole 147 also exhibits a bowing profile 150 in the first oxide layer 135. Either or both of these imperfections may act to prevent effective fill-in of the contact hole 147 with metal (e.g., tungsten) at a later process stage, thereby degrading quality of the final integrated circuit. In order to mitigate these imperfections, a liner is deposited at step 715 as illustrated in FIG. 5A wherein a silicon nitride liner 155 is deposited that overlays an upper surface of the contact film stack 120 and coats an inside surface of the contact hole 147. An organic dielectric layer (ODL) is deposited at step 720. FIG. 5B illustrates the result of coating the structure of FIG. 5A with an ODL 160. The liner 80 is then etched back at step 725 by bombarding the contact film stack 120 with particles (e.g., argon) 165 in order to expose the overhang 145 (FIG. 5D). Some of the ODL 160 is also etched back in the process, the etching back removing surface ODL 160 but leaving in place a bottom portion 161 of the ODL. Etchback of the liner layer 155 exposes the overhang 145 (FIG. 5D), thereby preparing the overhang 145 for etching at the next step. The etchback, further, may reduce a thickness of the liner layer so that the thickness of the liner layer 156 on a surface of the second oxide layer 140 as indicated in FIG. 5D is less than the thickness of the liner layer 155 in FIG. 5C. The presence of residual ODL 162 protects a bottom surface 157 of the contact hole 147 during this process.

At step 730 the contact film stack 120 is etched as illustrated in FIG. 5D with an etchant 170 having a high selectivity to oxide with respect to the material of the liner layer in order to remove an edge region of the opening of the contact hole 147. This removing may round out and smooth the overhang 145. According to one embodiment, where the liner 156 is formed of silicon nitride, the etchant may comprise $C_4F_6$, $C_4F_8$ or $C_5F_8$. Performing the high-selectivity etch may reshape the overhang 145 to produce a rounded and smooth profile 144 of the contact hole 147 as illustrated in FIG. 6A. Residual ODL 162 is removed at step 735 by employing a dry/wet process as described above with reference to FIG. 6B, thereby opening the contact hole 147. An anisotropic etch is performed at step 740 to remove the liner 156 and to prepare the contact hole 147 to be filled with metal. FIGS. 6C and 6D illustrate views in the X- and Y-directions, respectively, of the contact hole 147. The resulting contact hole 147 is characterized by a smooth, rounded profile 144 rather than the overhang 145 (FIG. 4C) and by a smooth and straight-sided opening due in part to fill-in of the bowing profile 150 (FIG. 4C) with liner material 170 (FIGS. 6C and 6D). Upper 144 and lower 175 portions of the contact hole 147 are not covered with liner material, a consequence of the anisotropic property of the etch performed at step 740. The contact hole 147 may subsequently be filled with conductive material such as tungsten to enable electrical contact in accordance with known practices in the art.

Although the disclosure herein refers to certain illustrated implementations and embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims For example, the invention may apply to other dielectric or conductance etch processes in DRAM as well as in NOR flash and NAND flash (including 3D NAND flash) memories as well as other semiconductor processes as will be clear to one skilled in the art.

What is claimed is:

1. A method of removing an overhang from an opening of a contact hole formed through a contact film stack of integrated circuit material, comprising:
   forming a contact film stack on a silicon substrate using a plurality of layers of dielectric material;
   forming a contact hole in the contact film stack on the silicon substrate;
   coating a surface of the contact film stack and an interior of the contact hole with liner material;
   removing the liner material to expose an overhang of at least one of the plurality of layers of dielectric material, wherein removing the liner material to expose the overhang comprises exposing the overhang in an outer layer of the contact film stack by removing the liner material from the outer layer while retaining at least portions of the liner material in one or more inner layers of the contact film stack;
   selectively removing the retained portions of the liner material from the one or more inner layers of the contact film stack while retaining a portion of the liner material in a bowing profile region of an inner layer of the contact film stack; and
   removing the overhang.

2. The method as set forth in claim 1, wherein the forming a contact film stack comprises forming two or more of a plasma-enhanced oxide (PEOX) layer, a low-pressure chemical vapor deposition from tetraethyl orthosilicate (LPTEOS) layer, a borophosphosilicate glass (BPSG) layer, and an undoped silicon glass (USG) layer.

3. The method as set forth in claim 1, wherein the forming a contact film stack uses a plurality of layers of oxide material and controls a profile of the contact hole, and the removing the liner material to expose an overhang of at least one of the plurality of layers of dielectric material comprises bombarding.

4. The method as set forth in claim 3, wherein the forming a contact hole produces a rounded profile in a top oxide layer.

5. The method as set forth in claim 1, wherein the removing the liner material to expose an overhang of at least one of the plurality of layers of dielectric material comprises bombarding the liner material with argon to reduce a thickness of the liner material on the surface of the contact film stack while removing liner material to expose the overhang.

6. The method as set forth in claim 1, further comprising performing an anisotropic etch to remove at least a portion of the liner material.

7. The method of claim 1, wherein forming the contact hole comprises:
   forming the contact hole with dimensions that are different in different layers of dielectric material.

8. A method of forming a contact hole in a contact film stack of an integrated circuit, comprising:
   etching a contact film stack on a silicon substrate to form a contact hole with an overhang of at least one dielectric material;
   coating the contact film stack and an interior of the contact hole with a liner material;
   removing a top portion of the liner material to form a tapered opening, comprising:
      removing the liner material from an outer layer of the contact film stack to expose an overhang in the outer layer while retaining at least portions of the liner material in one or more inner layers of the contact film stack, and
      selectively removing the retained portions of the liner material from the one or more inner layers of the contact film stack while retaining a portion of the liner material in a bowing profile region of an inner layer of the contact film stack; and
   filling the tapered opening with conductive material to enable electrical contact.

9. The method as set forth in claim 8, wherein the coating with liner material comprises coating with a layer of silicon nitride.

10. The method as set forth in claim 8, wherein the removing comprises bombarding the contact film stack with argon whereby liner material is removed from the overhang, a thickness of the liner material on a surface of the contact film stack is reduced, and a profile of a lower portion of the contact hole is protected.

11. The method as set forth in claim 10, wherein the liner material comprises silicon nitride and the removing comprises etching with an etchant having a high selectivity to oxide with respect to silicon nitride, whereby the overhang is made rounded and smooth.

12. The method of claim 8, wherein the tapered opening is formed in a portion of the contact hole filled in by the liner material.

13. The method of claim 12, wherein the tapered opening is disposed below an upper opening of the contact hole, the upper opening being disposed in dielectric material.

14. The method of claim 8, wherein the contact film stack includes a plurality of layers of dielectric material.

15. A method comprising:
   forming a contact film stack of integrated circuit material using a plurality of layers of oxide material;
   forming a contact hole in the plurality of layers of oxide material comprising the contact film stack;
   coating a surface of the contact film stack and an interior of the contact hole with liner material;
   removing the liner material to expose an overhang of at least one of the plurality of layers of oxide material, wherein removing the liner material to expose the overhang comprises exposing the overhang in an outer layer of the contact film stack by removing the liner material from the outer layer while retaining at least portions of the liner material in one or more inner layers of the contact film stack;
   selectively removing the retained portions of the liner material from the one or more inner layers of the contact film stack while retaining a portion of the liner material in a bowing profile region of an inner layer of the contact film stack; and
   removing the overhang.

16. The method as set forth in claim 15, wherein forming the contact film stack comprises forming two or more of a plasma-enhanced oxide (PEOX) layer, a low-pressure chemical vapor deposition from tetraethyl orthosilicate (LPTEOS) layer, a borophosphosilicate glass (BPSG) layer, and an undoped silicon glass (USG) layer.

17. The method as set forth in claim 15, wherein forming the contact film stack comprises controlling a profile of the contact hole, and
   wherein removing the liner material to expose the overhang of at least one of the plurality of layers of oxide material comprises bombarding.

18. The method as set forth in claim 17, wherein forming the contact hole produces a rounded profile in a top oxide layer.

19. The method as set forth in claim 15, wherein removing the liner material to expose the overhang of at least one of the plurality of layers of oxide material comprises bombarding the liner material with argon to reduce a thickness of the liner material on the surface of the contact film stack while removing liner material to expose the overhang.

20. The method as set forth in claim 15, further comprising performing an anisotropic etch to remove at least a portion of the liner material.

* * * * *